(12) United States Patent
Champion (10) Patent No.: US 6,965,980 B2
(45) Date of Patent: Nov. 15, 2005

(54) MULTI-SEQUENCE BURST ACCESSING FOR SDRAM

(75) Inventor: Mark Champion, Kenmore, WA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 514 days.

(21) Appl. No.: 10/077,736

(22) Filed: Feb. 14, 2002

(65) Prior Publication Data
US 2003/0151609 A1 Aug. 14, 2003

(51) Int. Cl.$^7$ .............................................. G06F 12/00
(52) U.S. Cl. .......................... 711/217; 711/5; 711/219; 711/220; 710/29
(58) Field of Search ............................ 711/5, 167, 169, 711/157, 147; 365/230.03, 230.04; 345/564, 566, 572, 571, 533, 534

(56) References Cited

U.S. PATENT DOCUMENTS

| | | | |
|---|---|---|---|
| 4,449,199 A | 5/1984 | Daigle | 345/571 |
| 5,142,276 A | 8/1992 | Moffat | 345/545 |
| 5,195,182 A | 3/1993 | Sasson | 710/53 |
| 5,303,341 A | 4/1994 | Rivershin | 358/1.17 |
| 5,479,605 A | 12/1995 | Saitoh | 345/561 |
| 5,559,953 A | 9/1996 | Seiler et al. | 345/543 |
| 5,561,777 A | 10/1996 | Kao et al. | 711/5 |
| 5,579,473 A | 11/1996 | Schlapp et al. | 345/557 |
| 5,606,650 A | 2/1997 | Kelley et al. | 345/552 |
| 5,619,471 A | 4/1997 | Nunziata | 365/230.03 |
| 5,633,726 A | 5/1997 | Timmermans | 386/20 |
| 5,781,201 A | 7/1998 | McCormack et al. | 345/544 |
| 5,794,016 A | 8/1998 | Kelleher | 345/505 |
| 5,798,843 A | 8/1998 | Yamamoto et al. | 358/404 |
| 5,815,167 A | 9/1998 | Muthal et al. | 345/541 |
| 5,815,169 A | 9/1998 | Oda | 345/544 |

(Continued)

OTHER PUBLICATIONS

SMPTE Standard for Television 1927 × 1080 Scanning and Analog and Parallel Digital Interfaces for Multiple Picture Rates; SMPTE 274–1998; Copyright 1998, pp 1–24; Revision of ANSI/SMPTE 274M–1995; The Society of Motion Picture and Television Engineers; White Plains, New York.
Bloom, DM; *The Grating Light Valve: revolutionizing display technology*; pp 1–10; Silicon Light Machines (formerly Echelle, Inc) © 1997.
Corrigan, R.W. et al; An Alternative Architecture for High Performance Display; Presented at the 141$^{st}$ SMPTE Technical Conference and Exhibition; Nov. 20, 1999, New York, New York pp 1–5, Silicon Machines, Sunnyvale, California.
Hearn, D. et al; Computer Graphics C Version [2$^{nd}$ Ed] pp 53–56; Prentice Hall, Upper Saddle River, New Jersey.
Lieberman, David; *Sony champions MEMS display technology*; EE Times, Jul. 14, 2000; http://www.eetimes.com/story/OEG20000714S0004.
U.S. Appl. No. 10/051,538, filed Jan. 16, 2002, Champion.
U.S. Appl. No. 10/051,541, filed Jan. 16, 2002, Champion.
U.S. Appl. No. 10/051,680, filed Jan. 16, 2002, Champion.
U.S. Appl. No. 10/052,074, filed Jan. 16, 2002, Champion.

*Primary Examiner*—Donald Sparks
*Assistant Examiner*—Brian R. Peugh
(74) *Attorney, Agent, or Firm*—Thomas F. Lebens; Fitch, Even, Tabin & Flannery (57) ABSTRACT

Methods and apparatus for accessing memory locations in a memory device in different orders. In one implementation, a memory device includes: a memory array, including a plurality of memory locations divided into memory pages, where each memory location has a row address and a column address; a row decoder connected to the memory array for selecting a row address in the memory array; a column decoder connected to the memory array for selecting a column address in the memory array; and a multi-sequence address generator for generating addresses, where the multi-sequence address generator has a burst mode and in burst mode generates one of two or more burst sequences of addresses according to received burst parameters, and where each sequence has an index indicating the separation between two addresses in the sequence.

11 Claims, 6 Drawing Sheets

OTHER PUBLICATIONS

| | | | | |
|---|---|---|---|---|
| 5,831,926 A | * | 11/1998 | Norris et al. | 365/230.04 |
| 5,924,111 A | | 7/1999 | Huang et al. | 711/5 |
| 5,933,154 A | | 8/1999 | Howard et al. | 345/540 |
| 6,005,592 A | | 12/1999 | Koizumi et al. | 345/571 |
| 6,023,745 A | * | 2/2000 | Lu | 711/5 |
| 6,031,638 A | | 2/2000 | Rao et al. | 358/474 |
| 6,111,992 A | | 8/2000 | Likhterov et al. | 382/260 |
| 6,177,922 B1 | | 1/2001 | Schiefer et al. | 345/698 |
| 6,226,709 B1 | | 5/2001 | Goodwin et al. | 711/106 |
| 6,259,459 B1 | | 7/2001 | Middleton | 345/536 |
| 6,278,645 B1 | | 8/2001 | Buckelew et al. | 365/230.01 |
| 6,282,603 B1 | * | 8/2001 | Rao | 711/5 |
| 6,301,649 B1 | | 10/2001 | Takasugi | 711/217 |
| 6,331,854 B1 | | 12/2001 | Rogers et al. | 345/473 |
| 6,347,344 B1 | | 2/2002 | Baker et al. | 710/20 |
| 6,417,867 B1 | | 7/2002 | Hallberg | 345/660 |
| 6,496,192 B1 | | 12/2002 | Shreesha et al. | 345/540 |
| 6,519,673 B1 | * | 2/2003 | Chudnovsky et al. | 711/5 |
| 6,549,207 B1 | | 4/2003 | Matsumoto | 345/473 |
| 6,567,531 B1 | | 5/2003 | Kondo et al. | 382/100 |
| 6,587,112 B1 | | 7/2003 | Goeltzenleuchter et al. | 345/532 |
| 6,665,749 B1 | * | 12/2003 | Ansari | 710/29 |
| 2002/0109689 A1 | | 8/2002 | Champion | 345/536 |
| 2002/0109690 A1 | | 8/2002 | Champion | 345/536 |
| 2002/0109692 A1 | | 8/2002 | Champion | 345/536 |
| 2002/0109693 A1 | | 8/2002 | Champion | 345/536 |
| 2002/0109694 A1 | | 8/2002 | Champion | 345/536 |
| 2002/0109695 A1 | | 8/2002 | Champion | 345/536 |
| 2002/0109696 A1 | | 8/2002 | Champion | 345/536 |
| 2002/0109698 A1 | | 8/2002 | Champion | 345/545 |
| 2002/0109699 A1 | | 8/2002 | Champion | 345/547 |
| 2002/0110030 A1 | | 8/2002 | Champion | 365/200 |
| 2002/0110351 A1 | | 8/2002 | Champion | 386/40 |
| 2002/0130876 A1 | | 9/2002 | Champion | 345/570 |
| 2002/0149596 A1 | | 10/2002 | Champion | 345/545 |
| 2003/0058368 A1 | | 3/2003 | Champion | 348/581 |
| 2003/0151609 A1 | * | 8/2003 | Champion | 345/571 |

* cited by examiner

FIG. 1A
(Prior Art)
105

| 0 | 1 | ... | $2^{21}-1$ |

| 0 | 1 | ... | 255 |
| 256 | 257 | ... | 511 |
| | | ... | |
| (X*(Y-1)) | | ... | (X*Y-1) |

| A20 | ... | A8 | A7 | ... | A0 |

| 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|
| 16 | 17 | 18 | 19 | 20 | 21 | 22 | 23 | 24 | 25 | 26 | 27 | 28 | 29 | 30 | 31 |
| 32 | 33 | 34 | 35 | 36 | 37 | 38 | 39 | 40 | 41 | 42 | 43 | 44 | 45 | 46 | 47 |
| 48 | 49 | 50 | 51 | 52 | 53 | 54 | 55 | 56 | 57 | 58 | 59 | 60 | 61 | 62 | 63 |
| 64 | 65 | 66 | 67 | 68 | 69 | 70 | 71 | 72 | 73 | 74 | 75 | 76 | 77 | 78 | 79 |
| 80 | 81 | 82 | 83 | 84 | 85 | 86 | 87 | 88 | 89 | 90 | 91 | 92 | 93 | 94 | 95 |
| 96 | 97 | 98 | 99 | 100 | 101 | 102 | 103 | 104 | 105 | 106 | 107 | 108 | 109 | 110 | 111 |
| 112 | 113 | 114 | 115 | 116 | 117 | 118 | 119 | 120 | 121 | 122 | 123 | 124 | 125 | 126 | 127 |
| 128 | 129 | 130 | 131 | 132 | 133 | 134 | 135 | 136 | 137 | 138 | 139 | 140 | 141 | 142 | 143 |
| 144 | 145 | 146 | 147 | 148 | 149 | 150 | 151 | 152 | 153 | 154 | 155 | 156 | 157 | 158 | 159 |
| 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 |
| 192 | 193 | 194 | 195 | 196 | 197 | 198 | 199 | 200 | 201 | 202 | 203 | 204 | 205 | 206 | 207 |
| 208 | 209 | 210 | 211 | 212 | 213 | 214 | 215 | 216 | 217 | 218 | 219 | 220 | 221 | 222 | 223 |
| 224 | 225 | 226 | 227 | 228 | 229 | 230 | 231 | 232 | 233 | 234 | 235 | 236 | 237 | 238 | 239 |
| 240 | 241 | 242 | 243 | 244 | 245 | 246 | 247 | 248 | 249 | 250 | 251 | 252 | 253 | 254 | 255 |

FIG. 4

| 0 | 1 | 2 | 3 | | | | | 16 | 17 | 18 | 19 | | | | |
|---|---|---|---|---|---|---|---|---|---|---|---|---|---|---|---|
| 4 | 5 | 6 | 7 | | | | | 20 | 21 | 22 | 23 | | | | |
| 8 | 9 | 10 | 11 | | | | | 24 | 25 | 26 | 27 | | | | |
| 12 | 13 | 14 | 15 | | | | | 28 | 29 | 30 | 31 | | | | |
| | | | | 32 | 33 | 34 | 35 | | | | | 48 | 49 | 50 | 51 |
| | | | | 36 | 37 | 38 | 39 | | | | | 52 | 53 | 54 | 55 |
| | | | | 40 | 41 | 42 | 43 | | | | | 56 | 57 | 58 | 59 |
| | | | | 44 | 45 | 46 | 47 | | | | | 60 | 61 | 62 | 63 |
| 64 | 65 | 66 | 67 | | | | | 80 | 81 | 82 | 83 | | | | |
| 68 | 69 | 70 | 71 | | | | | 84 | 85 | 86 | 87 | | | | |
| 72 | 73 | 74 | 75 | | | | | 88 | 89 | 90 | 91 | | | | |
| 76 | 77 | 78 | 79 | | | | | 92 | 93 | 94 | 95 | | | | |
| | | | | 96 | 97 | 98 | 99 | | | | | 112 | 113 | 114 | 115 |
| | | | | 100 | 101 | 102 | 103 | | | | | 116 | 117 | 118 | 119 |
| | | | | 104 | 105 | 106 | 107 | | | | | 120 | 121 | 122 | 123 |
| | | | | 108 | 109 | 110 | 111 | | | | | 124 | 125 | 126 | 127 |

MULTI-SEQUENCE BURST ACCESSING FOR SDRAM

RELATED APPLICATIONS

This application is related to the following co-pending and commonly assigned patent applications: U.S. application Ser. No. 10/051,538, filed Jan. 16, 2002. U.S. application Ser. No. 10/051,680, filed Jan. 16, 2002; U.S. application Ser. No. 10/052,074, filed Jan. 16, 2002; and U.S. application Ser. No. 10/051,541, filed Jan. 16, 2002, the disclosures of which are incorporated herein by reference.

BACKGROUND

The present invention is related to memory devices. More particularly, the present invention is related to SDRAM (synchronous dynamic random access memory).

One common type of memory is SDRAM. The structure and operation of SDRAM is well known. In overview, an SDRAM has a number of addressable memory locations that depends on the total size of the SDRAM and the size of each memory location. Each addressable memory location has a corresponding memory address. For example, an 8 MB (megabyte) SDRAM where each location is 32 bits has 2,097,152 addressable locations, while an 8 MB SDRAM where each location is 8 bits has four times as many addressable locations. One example of a conventional SDRAM is 2M×32 SDRAM MT48LC2M32B2 by Micron Technology, Inc.

Figure 1A:
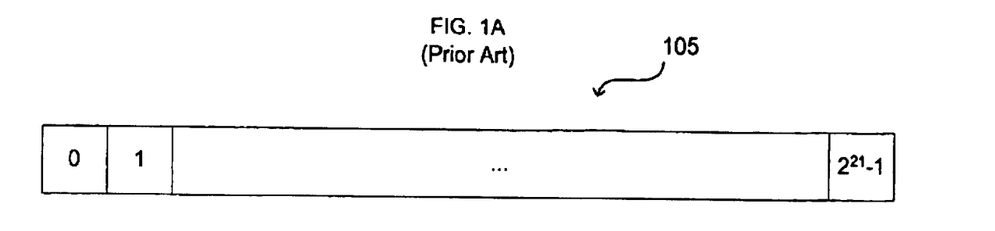
FIG. 1A is a representation of 2,097,152 memory locations as a one-dimensional array.
Figure 1B:
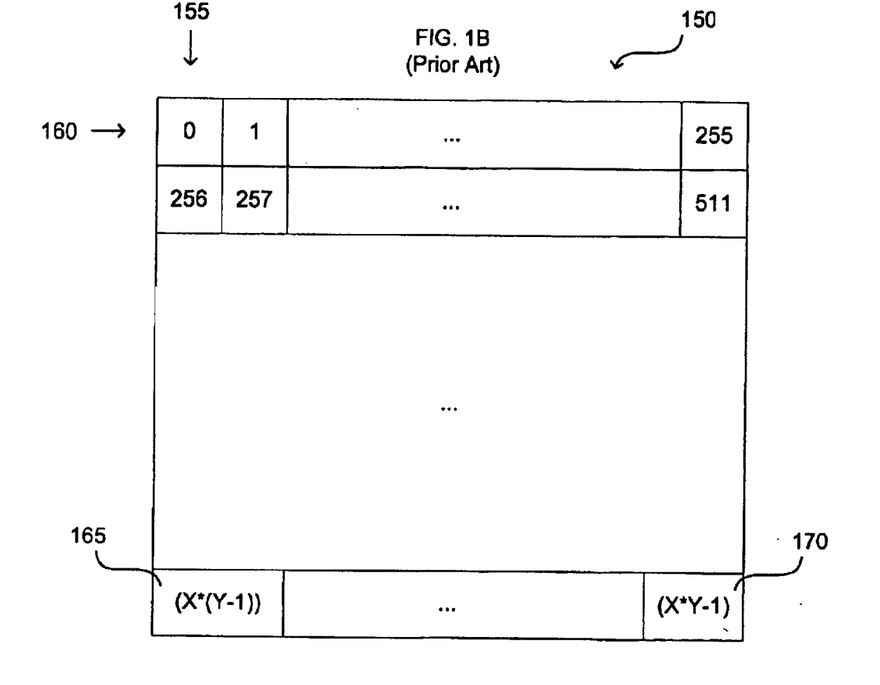
FIG. 1B is a representation of 2,097,152 memory locations as a two-dimensional array or grid.

FIG. 1A is a representation of 2,097,152 memory locations as a one-dimensional array 105. Memory cells in a typical SDRAM are physically arranged in a two-dimensional grid and so individual cells or groups of cells (i.e., memory locations) can be identified using a combination of a row number and a column number. The memory locations within the same row are often collectively referred to as a "page." FIG. 1B is a representation of 2,097,152 memory locations as a two-dimensional array or grid 150 having X columns 155 and Y rows 160. In FIG. 1B, X is 256 and Y is 8192. Accordingly, grid 150 has 256 columns 155, from 0 to X−1, and 8192 rows or pages 160, from 0 to Y−1. The location in row y at column x has address (y*X+x). For example, location 165 (the first location in the last page) has address (X*(Y−1)) and location 170 (the last location in the last page) has address (X*Y−1). The sizes of the boxes representing locations in FIG. 1B are representative and not to scale, so different size boxes are not different size memory locations (e.g., locations 165 and 170).

Figure 1C:
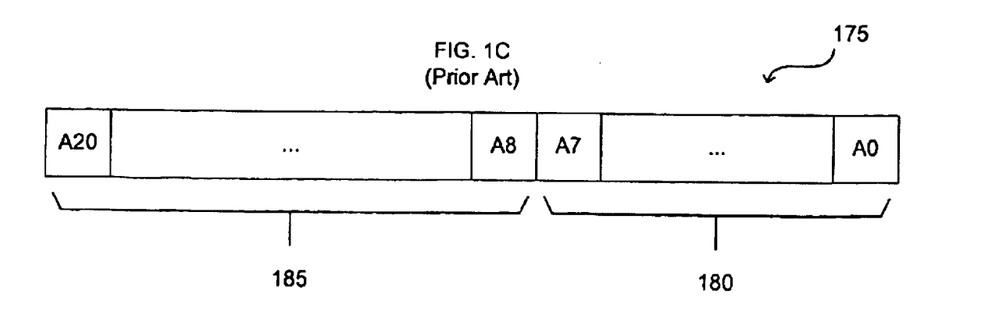
FIG. 1C is a representation of an address for one memory location out of 2,097,152.

An address for a memory location can be viewed as a combination of a row address and a column address. FIG. 1C is a representation of an address 175 for one memory location out of 2,097,152. Address 175 has 21 bits, with A0 as the lowest order bit. The lower 8 bits, A0 to A7, are a column address 180, ranging from 0 to 255. The upper 13 bits, A8 to A20, are a row or page address 185, ranging from 0 to 8191.

Due to the nature of the construction of SDRAM, an entire page of memory cells is active at a time. Accessing cells within the same active page can be accomplished relatively quickly using a series of column addresses without changing the page address and activating a new page. To change pages, a new page address is used and an additional delay is incurred from both the extra address cycle and a delay in the memory changing which page is active. This delay is referred to as a "page miss" and can result in a loss in speed.

SUMMARY

The present invention provides methods and apparatus for accessing memory locations in a memory device in different orders. In one implementation, a memory device includes: a memory array, including a plurality of memory locations divided into memory pages, where each memory location has a row address and a column address; a row decoder connected to the memory array for selecting a row address in the memory array; a column decoder connected to the memory array for selecting a column address in the memory array; and a multi-sequence address generator for generating addresses, where the multi-sequence address generator has a burst mode and in burst mode generates one of two or more burst sequences of addresses according to received burst parameters, and where each sequence has an index indicating the separation between two addresses in the sequence.

In another implementation, a method of generating a burst sequence of addresses includes: receiving a burst request, including a starting address, an index parameter, and a burst length, where the index parameter indicates an index; and generating a burst sequence of one or more addresses having a number of addresses equal to the burst length, where the first address is the starting address and any additional addresses are generated by adding the index to the previous address in the burst sequence.

DETAILED DESCRIPTION

The present invention provides methods and apparatus for accessing memory locations in a memory device in different orders. As described below, in one implementation, data is stored in the memory device in a first order and data is retrieved from the memory device in a second order. The memory device provides burst accessing for two or more orders of accessing using corresponding sequences of addresses. Accordingly, burst accessing is used for both orders of accessing memory locations and can improve performance. In an implementation used for storing and retrieving pixel data, pixel data can be stored according to horizontal rows of pixels and retrieved according to vertical columns of pixels, using burst accessing for both storing and retrieving pixel data.

As described below, providing multiple sequences of burst accessing increases the opportunities for using burst accessing and so increases the availability of the address bus of the SDRAM. This increased availability can be used in various ways, such as for activating a different page in the SDRAM to be accessed after the burst access completes.

Many types of SDRAM provide burst accessing or a burst mode. Burst accessing is a well known technique in memory devices for accessing memory locations that are in the same page. One type of conventional burst accessing is sequential burst accessing. In sequential burst accessing, memory locations are accessed that have consecutive addresses (e.g., addresses 0, 1, 2, 3). Another type of burst accessing is interleaved burst accessing. In interleaved burst accessing, a series of tightly grouped memory locations are accessed (e.g., addresses 1, 0, 3, 2).

Using one type of sequential burst accessing, an initial starting address is supplied with information indicating a burst access and a burst length. For example, a request can be made to access the first eight locations of a page of memory (e.g., starting address 0 and burst length 8). The SDRAM accesses a series of locations beginning with the starting address. The SDRAM generates a series of column addresses internally by incrementing from the supplied starting address by one for each location to be accessed. The additional addresses are not externally supplied to the SDRAM and so the address bus is available during the burst accessing. The SDRAM stops the burst accessing after accessing a number of locations equal to the supplied burst length. Typical burst lengths include 2, 4, and 8. Because the address bus for the SDRAM is available during the burst access, the address bus can be used for other instructions to the SDRAM.

A single SDRAM can have multiple banks, such as two or four. For example, 2M×32 SDRAM MT48LC2M32B2 by Micron Technology, Inc., has four banks. The memory locations are divided among the available banks. Each bank is a separate physical unit and one page can be active in each bank. In an SDRAM having four banks, four pages can be active at the same time. As described above, a delay occurs between requesting a new page to become active and when the new page is active. This delay can be avoided or hidden in an SDRAM using multiple banks. While accessing an active page in a first bank, a request is made to activate a page in a second bank. During the time needed to bring the second page active, the first page continues to be accessed. By properly timing the request to activate the second page, when the second page is first accessed, the second page will already be active. In order to activate the second page while accessing the first page, the request can be made while a burst access is being made to the first page. As described above, during burst accessing the address bus is available. The request to activate the second page can be made while the address bus is available. At the end of the burst access to the first page, the second page is active in the second bank and the second page can be accessed without a delay after the last access to the first page. Accordingly, sequential burst accessing can be used to avoid page misses when accessing series of memory locations having consecutive addresses.

In some applications, it is desirable to access memory locations in an SDRAM in two or more different sequences. For example, to use consecutive addresses (e.g., addresses 0, 1, 2, 3, 4, . . . ) and to use addresses separated by a constant, such as 16 (e.g., addresses 0, 16, 32, 48, 64, . . . ). Accordingly, it is advantageous to be able to take advantage of burst accessing for both sequences. The present invention provides a multi-sequence burst access SDRAM that generates burst address sequences according to multiple sequences.

Each sequence of burst accessing has an index. The index indicates the amount to add to the previous address to generate the next address in the sequence. For example, an index of one generates a sequence of consecutive addresses, such as 0, 1, 2, 3. An index of two generates a sequence of addresses separated by one address, such as 0, 2, 4, 6, or 1, 3, 5, 7. An index of 16 generates a sequence of addresses such as 0, 16, 32, 48. Different implementations can provide different available indexes, and different numbers of available indexes. For example, one implementation provides two indexes: one and sixteen. Another implementation provides four indexes: one, two, four, and eight.

A multi-sequence burst access SDRAM includes an address generator. The address generator generates a sequence of addresses in a burst access by incrementing from the supplied starting address by the requested index. In one implementation, the address generator is a column address generator and generates column addresses, rather than complete addresses (i.e., addresses including a row address and a column address).

A burst access request specifies one of the available indexes provided by the SDRAM. In one implementation, the burst access request uses a code specifying an index, such as by using state or mode bits. For example, in an implementation providing indexes 1 and 16, a burst access request can include one bit to select the index. The value of the bit indicates which index to use: a 0 for burst accessing using an index of 1, or a 1 for burst accessing using an index of 16. Using a code can conserve the number of bits used to specify the index. In one implementation, the code can be provided as bits in the mode register of the SDRAM. By using previously reserved bits in a conventional SDRAM interface design, backward compatibility can be preserved.

In another implementation, the value of the index to be used is a parameter supplied with the burst access request. The SDRAM uses the supplied index parameter to generate the sequence of addresses, such as in a column address generator. In this case, any index can be supplied to the SDRAM (up to the maximum size of the index parameter, such as eight bits for indexes from 0 to 255). The index supplied is added to an address to generate the next address. For example, in one implementation, a burst access request specifies a starting address, an index (eight bits, so a value from 0 to 255), and a burst length. One burst access request could specify starting address 0, index 16, and a burst length of 4. This request would generate this sequence of addresses: 0, 16, 32, 48. This type of request provides dynamic flexibility in providing various sequences.

Figure 2:
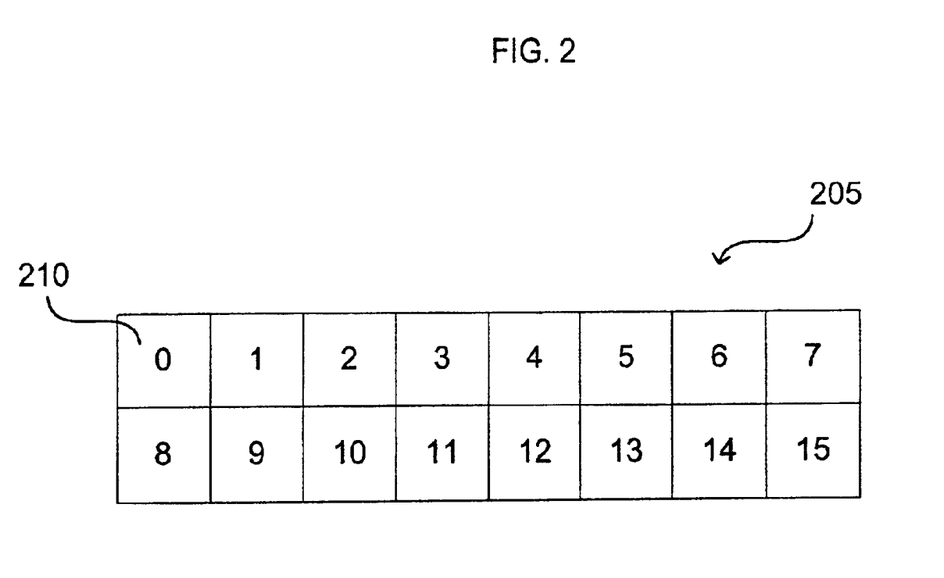
FIG. 2 is a representation of a page of memory locations according to one implementation of the present invention.

FIG. 2 is a representation of a page 205 of memory locations 210. Each memory location 210 is numbered with an address, starting from 0, left to right. In a first sequence of accessing the memory locations 210, such as for storing the data, memory locations 210 are accessed consecutively. This first sequence would access memory locations 210 using the following sequence of addresses: 0, 1, 2, 3, 4, 5, 6, 7, 8, 9, 10, 11, 12, 13, 14, 15. In a second sequence of accessing the memory locations 210, such as for retrieving data, memory locations 210 are accessed by accessing every second memory location, in two passes. This second sequence would access memory locations 210 using the following sequence of addresses: 0, 2, 4, 6, 8, 10, 12, 14, 1, 3, 5, 7, 9, 11, 13, 15. In one type of conventional sequential burst accessing, the first sequence of addresses could be generated using two burst accesses, each having a burst length of eight. However, this type of sequential burst accessing would not generate the second sequence of addresses because this burst accessing generates consecutive addresses. The second sequence would be generated "manually" by supplying each of the addresses to the SDRAM.

One implementation of a multi-sequence burst access SDRAM provides two sequences of burst accessing: an index of one, and an index of two. In this implementation, the two sequences described above referring to FIG. 2 can be generated using burst accessing. The first sequence can be generated using two burst accesses: starting address 0, index 1, burst length 8; and starting address 8, index 1, burst length 8. The first burst access would generate addresses 0, 1, 2, 3, 4, 5, 6, 7. The second burst access would generate addresses 8, 9, 10, 11, 12, 13, 14, 15. The second sequence can be generated using two burst accesses: starting address 0, index 2, burst length 8; and starting address 1, index 2, burst length 8. The first burst access would generate addresses 0, 2, 4, 6, 8, 10, 12, 14. The second burst access would generate addresses 1, 3, 5, 7, 9, 11, 13, 15. The row address remains constant while only the column address changes during burst accessing.

A multi-sequence burst access SDRAM can be used for video data applications, such as with pixel data and pixel pages, as described in U.S. application Ser. No. 10/051,538 (which is incorporated herein by reference). In this case, each memory location of the SDRAM stores pixel data for a pixel. Using pixel pages, one page of memory stores pixel data for pixels from multiple rows and multiple columns in the frame.

Figure 3:
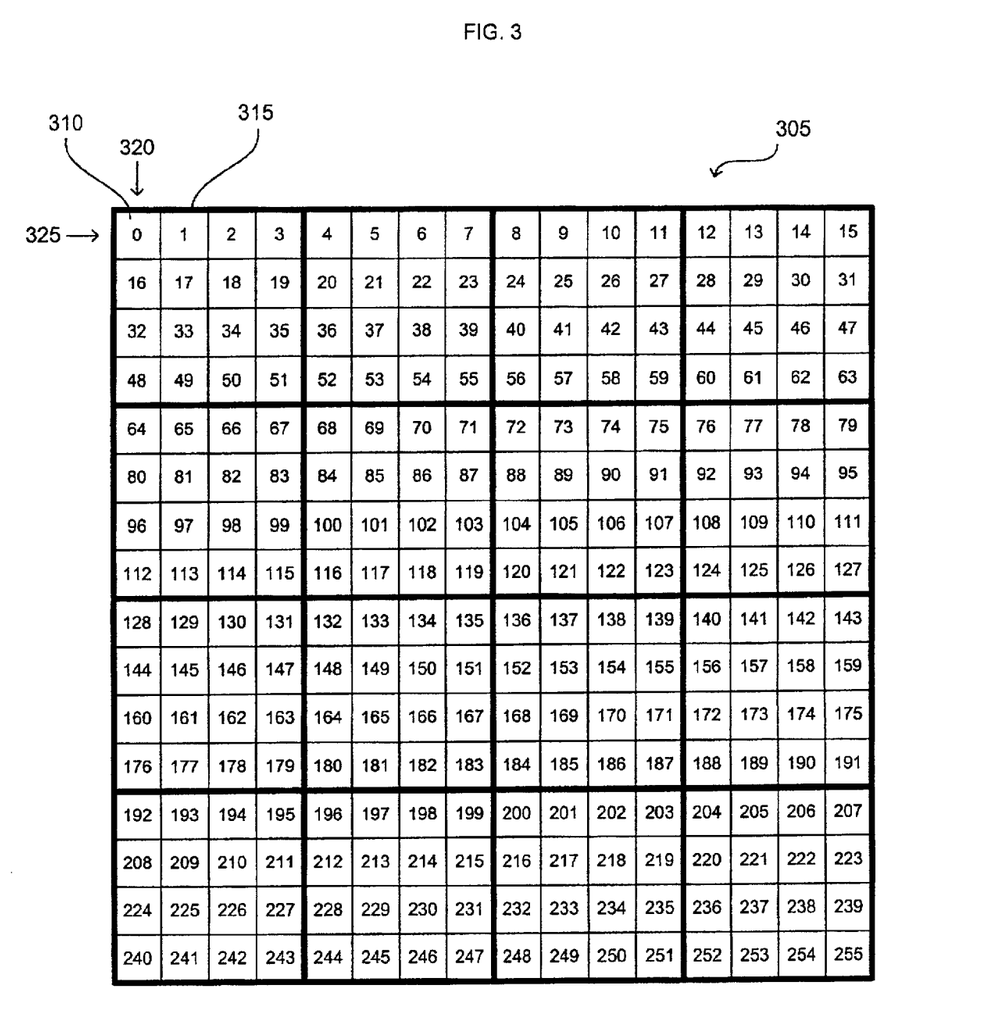
FIG. 3 is an example of a frame of pixels divided into pixel pages according to one implementation of the present invention.

FIG. 3 is an example of a frame 305 of pixels 310 divided into pixel pages 315. Frame 305 has 256 pixels in 16 columns 320 and 16 rows 325. Pixels 310 in frame 305 are sequentially numbered from 0 to 255. While frame 305 has 256 pixels, various resolutions are applicable, such as HD resolution 1920×1080. Frame 305 has 16 pixel pages 315, marked with heavier lines. Each pixel page 315 has 16 pixels 310 (4×4). In other applications, other pixel page geometries can be used, such as 8×32 or 16×16 for a memory page size of 256, or 16×64 for a memory page size of 1024. Pixel data can be stored according to horizontal rows of pixels and retrieved according to vertical columns of pixels using multi-sequence burst accessing. A first sequence of burst accessing can be used for storing pixel data and a second sequence of burst accessing can be used for retrieving data.

Figure 4:
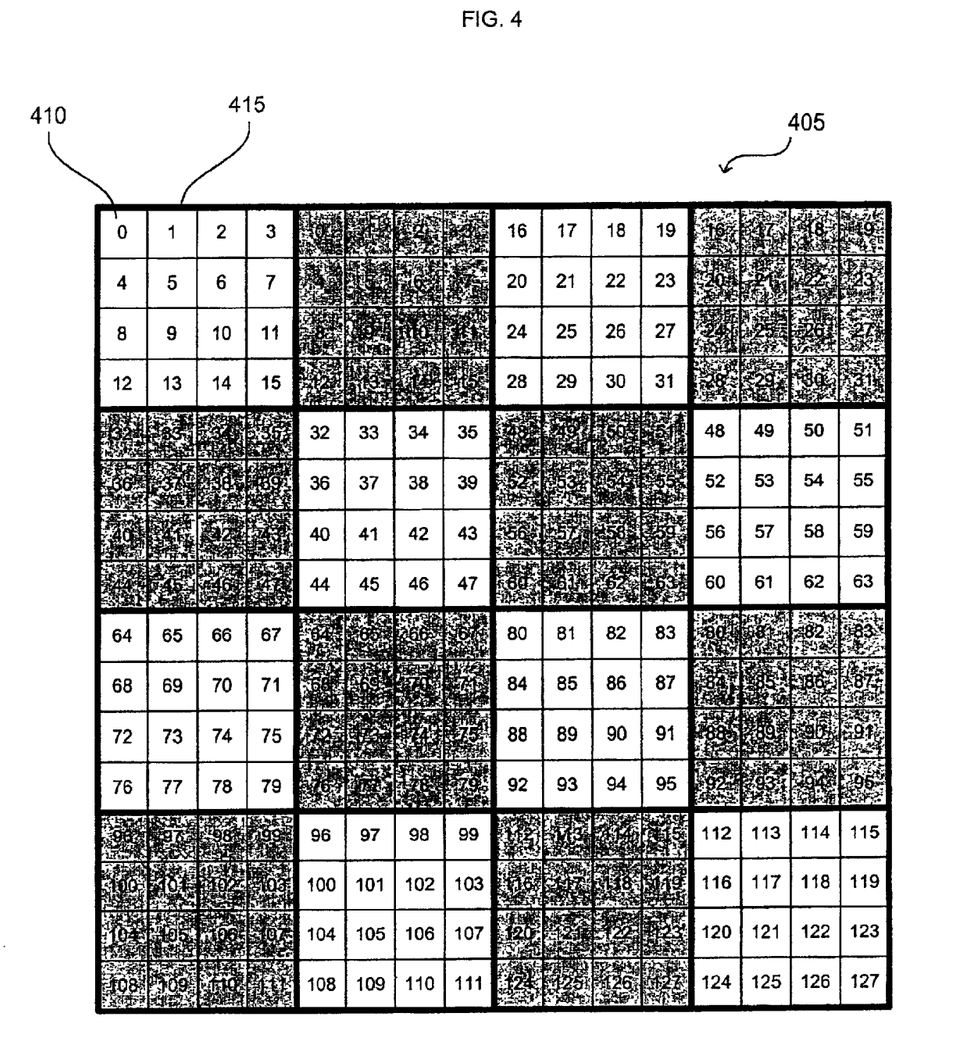
FIG. 4 is a representation of a frame of pixels divided into pixel pages to be stored in two memory banks according to the present invention.

In one implementation, pixel data for adjacent pixel pages, vertically and horizontally, is stored in different banks of the SDRAM. FIG. 4 is a representation of a frame 405 of pixels 410 divided into pixel pages 415 to be stored in two memory banks. Frame 405, pixels 410, and pixel pages 415 correspond to frame 305, pixels 310, and pixel pages 315, respectively, in FIG. 3. While pixels 310 in FIG. 3 are numbered according to pixel numbers, each pixel 410 in FIG. 4 is numbered according to the address of the memory location in one of the banks that stores pixel data for that pixel. In one implementation, the most significant bit of an address indicates which bank to access. In addition, pixels 410 having pixel data stored in the first bank are indicated by unshaded boxes, such as pixel 0 (recalling that, according to FIG. 3, pixel 0 is the first pixel in the top row of frame 305), and pixels having pixel data stored in the second memory bank are indicated by shaded boxes, such as pixel 4 (recalling that, according to FIG. 3, pixel 4 is the fifth pixel from the left in the top row of frame 305). For example, referring to FIGS. 3 and 4, pixel data for the pixel page including pixel 0 is in a first bank. Pixel data for the pixel page including pixel 4 is in a second bank. Pixel data for the pixel page including pixel 8 is in the first bank. Pixel data for the pixel page including pixel 64 is in the second bank. Pixel data for the pixel page including pixel 128 is in the first bank. This pattern continues throughout the pixel pages 315 of frame 305. Accordingly, while a page in one bank is being accessed using a burst access, a page in a different bank is being activated to be accessed. As a result, page misses can be hidden. A memory access request, including a burst access request, indicates which bank is being requested.

Referring to FIGS. 3 and 4, considering the first row of pixels 310 and pixel pages 315 in frame 305, pixel data for pixels 0, 1, 2, 3 is to be stored in a memory page in the first bank (bank 0) at addresses 0, 1, 2, 3, respectively. Pixel data for pixels 4, 5, 6, 7 is to be stored in a memory page in the second bank (bank 1) at addresses 0, 1, 2, 3, respectively. Pixel data for pixels 8, 9, 10, 11 is to be stored in another memory page in the first bank at addresses 16, 17, 18, 19, respectively. Pixel data for pixels 12, 13, 14, 15 is to be stored in another memory page in the second bank at addresses 16, 17, 18, 19, respectively. Pixel data for the first row of pixels 310 can be stored using four burst accesses: starting address 0, bank 0, index 1, burst length 4; starting address 0, bank 1, index 1, burst length 4; starting address 16, bank 0, index 1, burst length 4; starting address 16, bank 1, index 1, burst length 4. After making the first burst access request, a request is made to activate the memory page in the second bank to store pixel data for pixels 4, 5, 6, 7. While the first burst access is completing, the next page is activated. Accordingly, the second burst access request can be made immediately after the first burst access completes without a delay caused by the page miss. A similar pattern applies throughout the frame.

Considering the first column of pixels 310 and pixel pages 315 in frame 305, pixel data for pixels 0, 16, 32, 48 is to be retrieved from a memory page in the first bank (bank 0) at addresses 0, 4, 8, 12, respectively. Pixel data for pixels 64, 80, 96, 112 is to be retrieved from a memory page in the second bank (bank 1) at addresses 32, 36, 40, 44, respectively. Pixel data for pixels 128, 144, 160, 176 is to be retrieved from another memory page in the first bank at addresses 64, 68, 72, 76, respectively. Pixel data for pixels 192, 208, 224, 240 is to be retrieved from another memory page in the second bank at addresses 96, 100, 104, 108, respectively. Pixel data for the first column of pixels 310 can be retrieved using four burst accesses: starting address 0, bank 0, index 4, burst length 4; starting address 32, bank 1, index 4, burst length 4; starting address 64, bank 0, index 4, burst length 4; starting address 96, bank 1, index 4, burst length 4. After making the first burst access request, a request is made to activate the memory page in the second bank to retrieve pixel data for pixels 64, 80, 96, 112. While the first burst access is completing, the next page is activated. Accordingly, the second burst access request can be made immediately after the first burst access completes without a delay caused by the page miss. A similar pattern applies throughout the frame.

In another example, in an application using HD resolution 1920×1080 and pixel pages that are 8×32, multi-sequence burst accessing can be used to avoid page misses as well. Pixel data is stored according to horizontal rows of pixels, using burst accessing for the last pixels in each row of the pixel pages, such as using an index of 1 and burst length of 4 or 8. Using a burst length of 8, pixel data for pixels 0–7 can be stored using a single memory burst command requesting access beginning with address 0. The memory device would store pixel data to the memory locations having addresses 0–7 over 8 clock cycles. During those 8 clock cycles, the data bus of the memory device would be busy, but during the last 7 of the 8 clock cycles the address bus would be free. A request can be supplied to the memory device using the address bus to activate a page in another bank Similarly, pixel data is retrieved according to vertical columns of pixels, using burst accessing for the last pixels in the each column of the pixel pages, such as using an index of 8 and a burst length of 8. Accordingly, all the page misses in changing memory pages when moving between pixel pages can be hidden and an entire HD resolution frame of pixel data can be stored or retrieved without delaying for page misses (although there may be a delay for the initial page miss at the beginning of the first frame in a sequence of frames).

Figure 5:
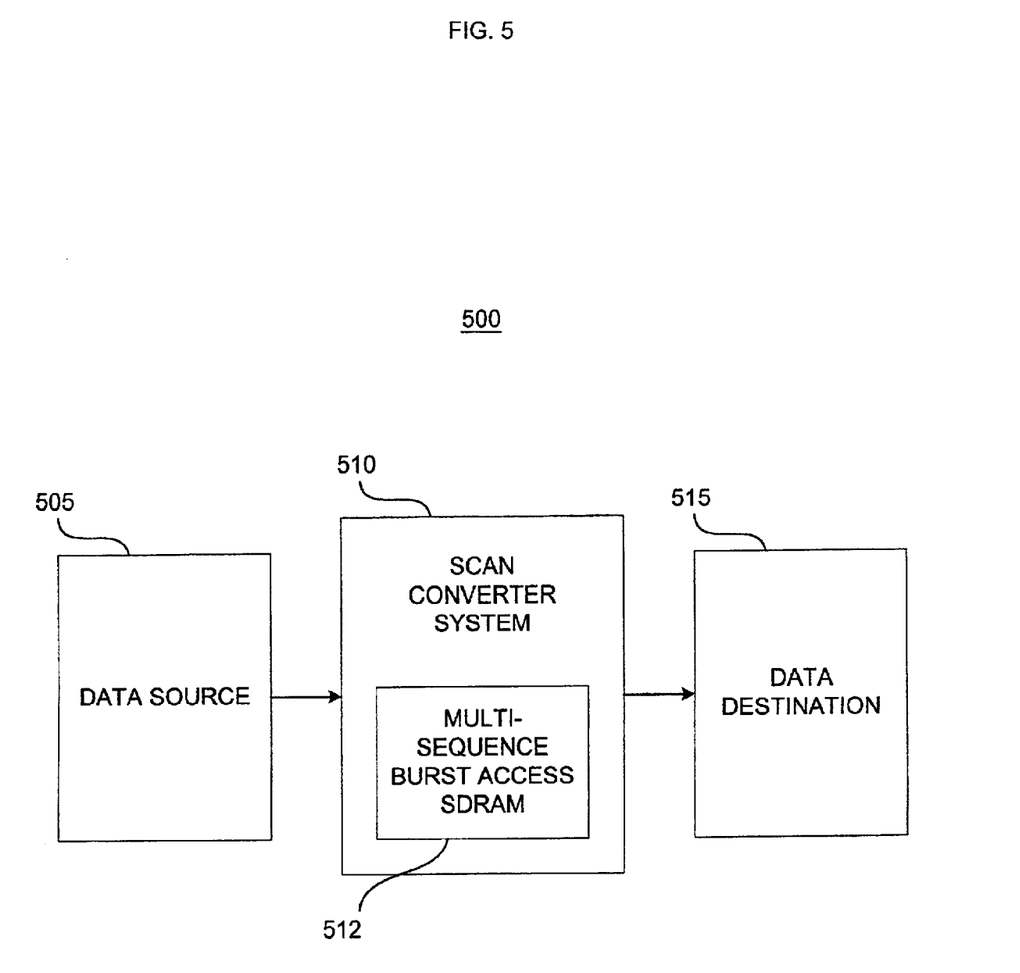
FIG. 5 is a block diagram of a data system according to one implementation of the present invention.

FIG. 5 is a block diagram of a data system 500. A data source 505 provides data to a scan converter system 510 in a first order. Scan converter system 510 includes a multi-sequence burst access SDRAM 512. SDRAM 512 has two sequences of burst accessing. Scan converter system 510 stores the data in SDRAM 512 according to the first order using a first sequence of burst accessing, as described above. Scan converter system 510 retrieves the data from SDRAM 512 in a second order using a second sequence of burst accessing and provides the retrieved data to a data destination 515.

Data source 505 can be a video source providing pixel data to scan converter system 510 and data destination 515 can be a display system, such as a grating light valve ("GLV") system, as referenced and described in U.S. application Ser. No. 10/051,538. In this case, data source 505 provides pixel data according to horizontal rows of pixels and data destination 515 receives pixel data according to vertical columns of pixels, as described above. Scan converter system 510 provides the conversion.

Figure 6:
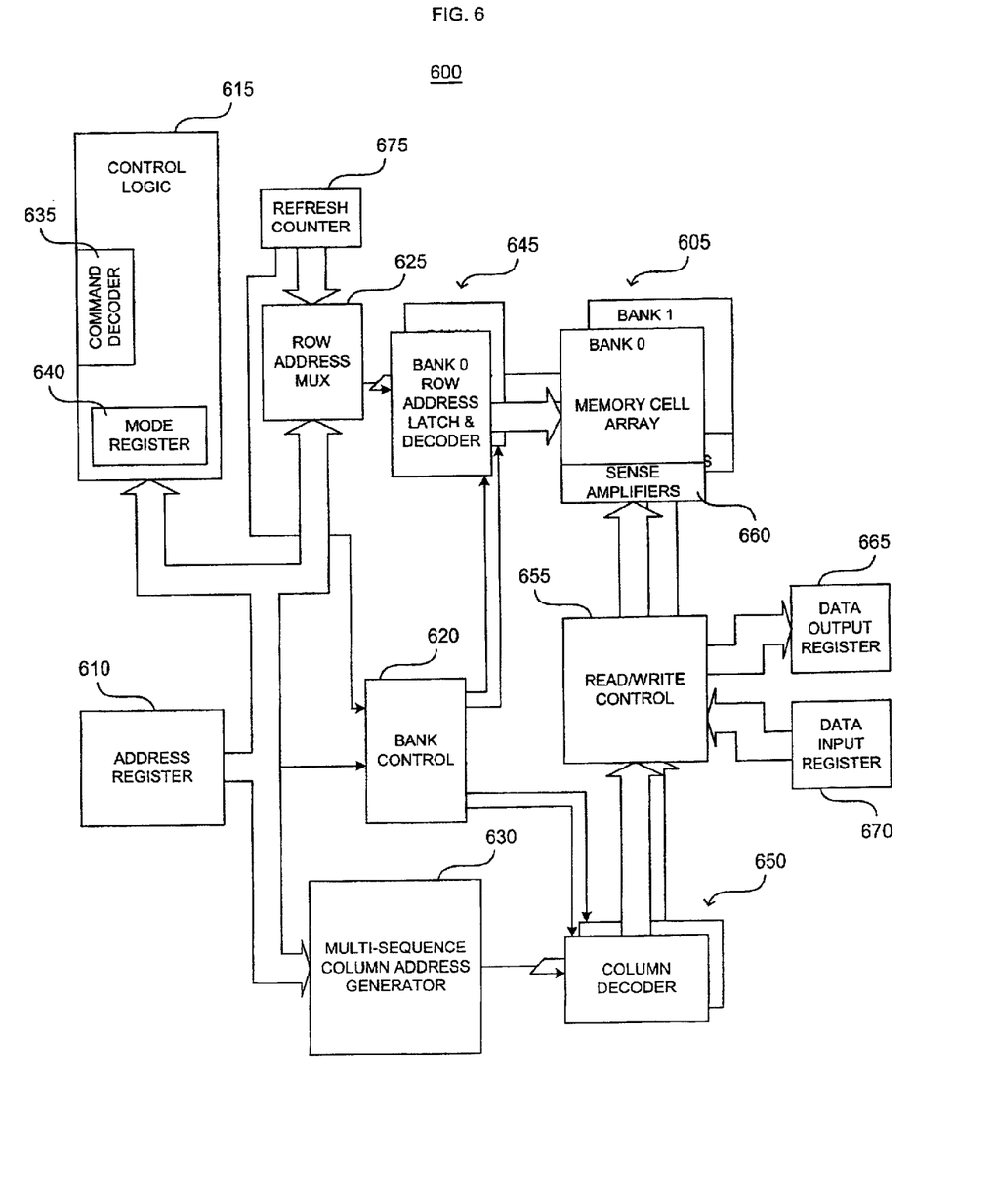
FIG. 6 is a block diagram of one implementation of a multi-sequence burst access SDRAM according to one implementation of the present invention.

FIG. 6 is a block diagram of one implementation of a multi-sequence burst access SDRAM 600. SDRAM 600 has two banks of memory cell arrays 605, labeled BANK 0 and BANK 1. Alternative implementations have different numbers of banks, such as four. As described above, each memory bank 605 includes memory cells arranged in a two-dimensional array of rows (pages) and columns. At the intersection of a row and a column is an addressable memory location, including one or more memory cells. An address includes a bank address, a row address, and a column address. The bank address indicates which memory bank 605 to access. The row address indicates which row or page to activate in the selected memory bank 605. The column address indicates which column in the selected row to access.

An address register 610 receives data from an external source, such as a memory controller (not shown), through a memory address bus. Address register 610 receives addresses to store and retrieve data and receives control data to control SDRAM 600 operation, such as burst access requests. Address register 610 is connected to control logic 615, bank control 620, a row address multiplexor 625, and a multi-sequence column address generator 630. Address register 610 provides control data to control logic 615. Address register 610 provides bank addresses to bank control 620, row addresses to row address multiplexor 625, and column addresses to multi-sequence column address generator 630.

Control logic 615 includes a command decoder 635 and a mode register 640. Command decoder 635 receives memory command signals (e.g., CS, WE, CAS, RAS) from an external source, such as a memory controller (not shown), and provides the commands to control logic 615. Mode register 640 receives control data from address register 610 and indicates to control logic 615 the requested mode of operation. Control logic 615 uses the decoded command signals and requested mode to operate SDRAM 600. Control logic 615 also receives timing signals (e.g., CKE, CLK) to operate synchronously. To control operation, control logic 615 is connected to components throughout SDRAM 600, however, these connections have been omitted for clarity. For example, control logic 615 provides the starting address, index, and burst length in a burst access request to multi-sequence column address generator 630.

Row address multiplexor 625 provides the row address to row address latches and decoders 645. Each row address latch and decoder 645 is connected to a respective memory bank 605. Row address latches and decoders 610 decode row addresses and activate pages of memory cells in memory banks 605.

Bank control 620 is connected to each row address latch and decoder 610. Bank control 620 uses the bank address received from address register 610 to determine which memory bank 605 to access. Bank control 620 sends a signal to the row address latch and decoder 645 corresponding to the memory bank indicated by the bank address to activate that row address latch and decoder 645. The activated row address latch and decoder 610 activates the appropriate page in the connected memory bank 605.

Multi-sequence column address generator 630 is connected to column decoders 650. Multi-sequence column address generator 630 generates sequences of addresses according to requested burst accesses, as described above, or passes addresses to column decoders 650 when not burst accessing. In one implementation, multi-sequence column address generator 630 generates and passes column addresses to column decoders 650. Each column decoder 650 is connected to bank control 620. Bank control 620 sends a signal to the column decoder 650 corresponding to the memory bank indicated by the bank address to activate that column decoder 650. Column decoders 650 decode column addresses and provide the decoded column addresses to a read/write control 655.

Read/write control 655 controls receiving data from and providing data to memory banks 605. Read/write control 655 includes drivers for selecting a selected column in memory banks 605. Each of memory banks 605 is also connected to or includes a respective sense amplifier array 660. Sense amplifier arrays 660 enhance the signal received from memory cells in memory banks 605 to provide the data value stored in the memory cells. Sense amplifier arrays 660 provide the values for an entire row or page as activated by row address latches and decoders 645. Column decoders 650 decode a column address indicating a selected column so read/write control 655 selects a value within sense amplifier arrays 660, where the value corresponds to the memory location at the intersection of the selected row and column in the selected memory bank 605.

A data output register 665 and a data input register 670 are connected to read/write control 655. Read/write control 655 provides data retrieved from memory banks 605 to data output register 665. Data input register 670 provides data to be stored in memory banks 605 through read/write control 655. In one implementation, data output register 665 and read/write control 655 receive data mask information (e.g., DQM) from an external source, such as a memory controller (not shown). Data output register 665 and data input register 670 provide a connection to an external data source/destination, such as through a memory data bus connected to a memory controller (not shown).

A refresh counter 675 is also connected to row address multiplexor 625. Refresh counter 675 provides row addresses to row address multiplexor 625 to activate pages while refreshing memory banks 605.

In operation, SDRAM 600 operates similarly to a typical SDRAM except for burst accessing. In one implementation, in storing or retrieving data using burst accessing, address register 610 receives a burst access request on the address bus for SDRAM 600. Address register 610 provides the starting address, the index, and the burst length to control logic 615 and mode register 640. In an alternative implementation, address register 610 provides part or all of this information to multi-sequence column address generator 630, such as the column address portion of the starting address, and to row multiplexor 625, such as the row address portion of the starting address. In another implementation, the row address and the column address are provided separately to address register 610. Multi-sequence column address generator 630 generates a sequence of addresses separated by the index starting from the starting address. After generating a number of addresses equal to the burst length, the burst access is complete. The address generation within SDRAM 600 is the same for storing and retrieving data, however the data flow among memory banks 605, read/write control 655, data input register 665, and data output register 670 is different.

FIG. 6 shows one architecture of a multi-sequence burst access SDRAM. Other architectures are also possible that provide the functionality described above, generating multiple sequences of burst accessing. For example, in another illustrative implementation, a multi-sequence burst access SDRAM has four banks of memory cells. Each bank has a respective row address latch and decoder, sense amplifier array, and column decoder. In other aspects, this implementation can have a structure similar to that described above referring to FIG. 6.

Various illustrative implementations of the present invention have been described. The above description focuses on SDRAM and describes examples using pixel data, but the methods and apparatus can be applied to different devices, as well as data other than pixel data. The present invention can be implemented in electronic circuitry, firmware, or in combinations of them. For example, the multi-sequence column address generator shown in FIG. 5 can be implemented in various ways, such as with an FPGA, a hardwired design, a microprocessor architecture, or a combination. However, one of ordinary skill in the art will see that additional implementations are also possible and within the scope of the present invention. Accordingly, the present invention is not limited to only those implementations described above.

What is claimed is:

1. A memory device comprising:
   a memory array, including a plurality of memory locations divided into memory pages, where each memory location has a row address and a column address;
   a row decoder connected to the memory array for selecting a row address in the memory array;
   a column decoder connected to the memory array for selecting a column address in the memory array; and
   a multi-sequence address generator for generating addresses, where the multi-sequence address generator has a burst mode and in burst mode generates one of two or more burst sequences of addresses according to received burst parameters, and where each sequence has an index indicating the separation between two addresses in the sequence;
   where the burst parameters include a starting address, an index parameter, and a burst length;
   where the index parameter is a code to select one of two or more indexes provided by the multi-sequence address generator.

2. The memory device of claim 1, where the memory array comprises two or more memory banks and one page can be active in each bank at one time.

3. The memory device of claim 2, where a second page can be activated while a first page is being accessed using a burst sequence.

4. The memory device of claim 1, where a row address indicates a page in the memory array, and a column address indicates a memory location within a page.

5. The memory device of claim 1, where the multi-sequence address generator supplies an address to the column decoder.

6. The memory device of claim 1, where one sequence has an index of one.

7. The memory device of claim 1, where one sequence has an index of eight.

8. The memory device of claim 1, where one sequence has an index of sixteen.

9. A memory device, comprising:
   a plurality of memory locations, where each memory location has an address; and
   an address generator, where the address generator generates two or more sequences of addresses by incrementing a starting address by an index corresponding to the sequence to be generated;
   where the address generator generates the sequences of the addresses according to received burst parameters, the index indicating the separation between two addresses in the sequence,
   where the burst parameters include the starting address, an index parameter, and a burst length;
   where the index parameter is a code to select one of two or more indexes provided by the address generator.

10. A data system, comprising:
   a data source providing data in a first data order;
   a data destination receiving data in a second data order; and
   a scan converter system including a multi-sequence memory device, where the multi-sequence memory device includes:
      a memory array, including a plurality of memory locations divided into memory pages, where each memory location has a row address and a column address;
      a multi-sequence address generator for generating addresses, where the multi-sequence address generator has a burst mode and in burst mode generates one of two burst sequences of addresses according to received burst parameters, each sequence has an index indicating the separation between two addresses in the sequence, and each of the two burst sequences corresponds to a respective data order;
      where the burst parameters include a starting address, an index parameter, and a burst length;
      where the index parameter is a code to select one of two or more indexes provided by the multi-sequence address generator.

11. A method of generating a burst sequence of addresses, comprising:
   receiving a burst request, including a starting address, an index parameter, and a burst length, where the index parameter indicates an index; and
   generating a burst sequence of one or more addresses having a number of addresses equal to the burst length, where the first address is the starting address and any additional addresses are generated by adding the index to the previous address in the burst sequence;
   where the index parameter is a code to select one of two or more indexes.

* * * * *